(12) United States Patent
Schlenker et al.

(10) Patent No.: US 8,492,973 B2
(45) Date of Patent: Jul. 23, 2013

(54) ORGANIC OPTOELECTRONIC COMPONENT HAVING A RADIATION-EMITTING LAYER CONTAINING AN ORGANIC MATERIAL

(75) Inventors: Tilman Schlenker, Nittendorf (DE); Markus Klein, Tegernheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/121,060

(22) PCT Filed: Sep. 1, 2009

(86) PCT No.: PCT/DE2009/001227
§ 371 (c)(1),
(2), (4) Date: Aug. 22, 2011

(87) PCT Pub. No.: WO2010/034280
PCT Pub. Date: Apr. 1, 2010

(65) Prior Publication Data
US 2012/0019131 A1    Jan. 26, 2012

(30) Foreign Application Priority Data

Sep. 25, 2008 (DE) .......................... 10 2008 048 829

(51) Int. Cl.
*H01L 51/50* (2006.01)
(52) U.S. Cl.
USPC ........................................................ 313/506
(58) Field of Classification Search
USPC ................................. 313/506, 504
See application file for complete search history.

(56) References Cited

U.S. PATENT DOCUMENTS

| | | | |
|---|---|---|---|
| 6,753,096 B2 * | 6/2004 | Duggal et al. | 428/690 |
| 6,821,009 B2 | 11/2004 | Ohkubo | |
| 7,744,948 B2 * | 6/2010 | Toyoda | 427/66 |
| 2005/0062412 A1 * | 3/2005 | Taniguchi et al. | 313/512 |
| 2005/0110384 A1 | 5/2005 | Peterson | |
| 2010/0157585 A1 | 6/2010 | Diekmann et al. | |

FOREIGN PATENT DOCUMENTS

| | | |
|---|---|---|
| CN | 1462161 | 12/2003 |
| DE | 10 2007 060 585 | 6/2009 |
| EP | 1 180 805 | 8/2001 |
| EP | 1 369 923 | 7/2002 |
| EP | 1 367 677 | 12/2003 |
| EP | 1 571 475 | 3/2004 |
| EP | 1 448 026 | 8/2004 |

(Continued)

OTHER PUBLICATIONS

English Translation of JP 2002-313571 A (Oct. 2002).*

(Continued)

*Primary Examiner* — Anh Mai
*Assistant Examiner* — Hana Feathrly
(74) *Attorney, Agent, or Firm* — Cozen O'Connor

(57) ABSTRACT

An organic, optoelectronic component (10) is specified, comprising a three-dimensional substrate body (1), which has a closed substrate surface (1*a*), a radiation-emitting layer sequence (2), which has at least one layer (2*a*, 2*b*, 2*c*, 2*d*, 2*e*), containing an organic material, wherein the radiation-emitting layer sequence (2) is applied to the closed substrate surface (1*a*) and forms a curved area.

14 Claims, 5 Drawing Sheets

FOREIGN PATENT DOCUMENTS

| | | |
|---|---|---|
| JP | 10-039811 | 2/1998 |
| JP | 10-039981 | 2/1998 |
| JP | 2002313571 A * | 10/2002 |
| WO | WO 2006/019576 | 2/2006 |
| WO | WO 2006/036890 | 4/2006 |
| WO | WO 2007/130025 | 11/2007 |
| WO | WO 2007/148771 | 12/2007 |

OTHER PUBLICATIONS

"Vitex and Novaled will cooperate on OLED thin film encapsulation", PR of Aug. 29, 2008, www.printedelectronicsworld.com.

* cited by examiner

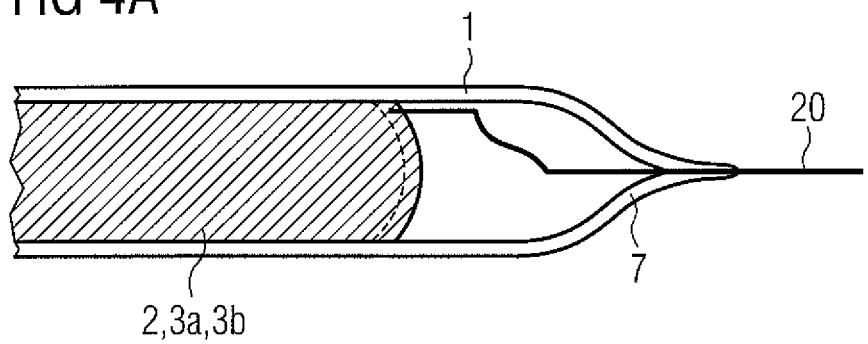
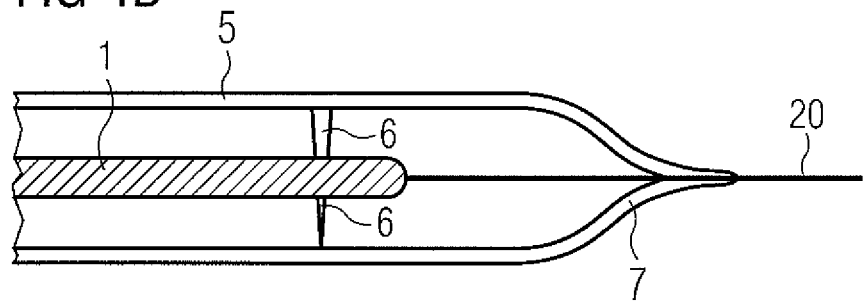
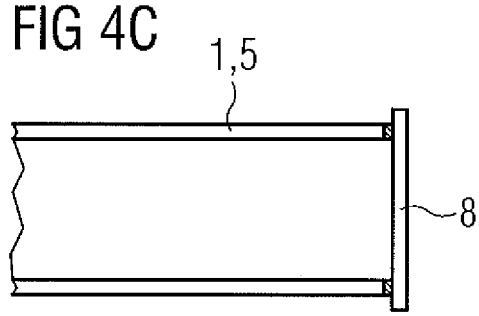
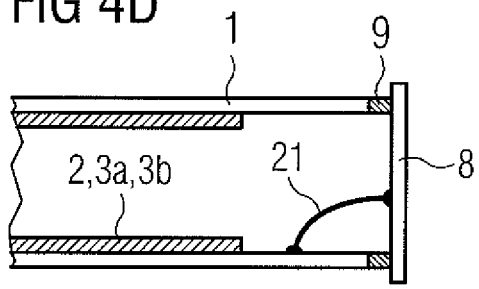

ORGANIC OPTOELECTRONIC COMPONENT HAVING A RADIATION-EMITTING LAYER CONTAINING AN ORGANIC MATERIAL

RELATED APPLICATIONS

This is a U.S. national stage of application No. PCT/DE2009/001227, filed on Sep. 1, 2009.

This application claims the priority of German application no. 10 2008 048 829.1 filed Sep. 25, 2008, the entire content of which is hereby incorporated by reference.

FIELD OF THE INVENTION

An organic, optoelectronic component is specified.

One object to be achieved is to provide an organic, optoelectronic component which can be encapsulated in a particularly simple manner. A further object is to provide an organic, optoelectronic component which can emit electromagnetic radiation particularly uniformly in different directions.

In accordance with at least one embodiment of the organic, optoelectronic component, the component comprises a three-dimensional substrate body. In this case, a substrate body should be understood to mean a body which has a substrate surface. A substrate surface is a surface to which radiation-emitting structures can be applied. In this case, the substrate surface is preferably embodied in a smooth fashion. That is to say that the substrate surface has only little roughness. In this way, layers of uniform thickness can be applied to the substrate surface in a particularly simple manner.

The substrate body is preferably a rigid body having no or hardly any flexibility.

In accordance with at least one embodiment of the component described here, the substrate body comprises a closed substrate surface provided for accommodating radiation-emitting structures. In this case, a closed surface should be understood to mean a surface of the three-dimensional substrate body which extends in all three spatial directions. If the closed substrate surface is traversed along a predefined direction, then after one circulation it is possible to end at the starting point of the circulation. The substrate surface is therefore preferably a contiguous, three-dimensional area.

In this case, the substrate surface can be formed for example by a portion of a lateral surface of the three-dimensional substrate body. If the substrate body in one simple embodiment has the form of a cylinder, for example, then the substrate surface can be formed by a circumferential portion of the lateral surface of the cylinder. That is to say that the cylinder is then provided with a closed substrate surface circumferentially at least in places. If the substrate body in another simple embodiment is a hollow cylinder, then the substrate surface can be formed by a circumferential region of the inner area of the lateral surface of the cylinder.

Overall, the substrate body thus has a closed, three-dimensional substrate surface provided for accommodating a radiation-generating structure.

In accordance with at least one embodiment of the component described here, the component furthermore comprises a radiation-emitting layer sequence, which has at least one layer containing an organic material. Preferably, the organic material is an emitter material, which, for example, emits electromagnetic radiation upon energization with an electric current. Preferably, the organic material is in this case suitable for emitting light, that is to say visible electromagnetic radiation. The component is an organic light-emitting diode (OLED), for example.

In accordance with at least one embodiment of the component described here, the radiation-emitting layer sequence is applied to the closed substrate surface. That is to say that the closed substrate surface is covered by the radiation-emitting layer sequence at least in places.

In this case, it is possible for the radiation-emitting layer sequence to be applied on the substrate surface in such a way that it itself forms a curved area. That is to say that, for example, the top side of the radiation-emitting layer sequence that is remote from the substrate surface forms a three-dimensional, curved area. That is to say that the radiation-emitting layer sequence extends along the three spatial directions. The radiation-emitting layer sequence therefore itself forms a three-dimensional structure and constitutes a portion of a three-dimensional body. In this case, the radiation-emitting layer sequence, in its course, follows the substrate surface at least in places and has a three-dimensional curved area.

In accordance with at least one embodiment of the component described here, the component comprises a three-dimensional substrate body, which has a closed substrate surface. Furthermore, the component comprises a radiation-emitting layer sequence, which has at least one layer containing an organic material. In this case, the radiation-emitting layer sequence is applied to the closed substrate surface and forms a curved area.

An organic, optoelectronic component described here is in this case based on the insight, inter alia, that the organic material of the radiation-emitting layer sequence can be applied to a closed substrate surface in a particularly simple manner and with virtually 100% material efficiency. Furthermore, a three-dimensional radiation-emitting layer sequence extending along the three spatial directions is distinguished by the fact that it can emit electromagnetic radiation in all spatial directions. With the component described here, therefore, it is possible to produce a luminous means which can illuminate a space very uniformly for example in the manner of an incandescent bulb or fluorescent tube.

In accordance with at least one embodiment of the component described here, the substrate body is embodied as a hollow body and the substrate surface is formed by at least one portion of the inner area of the hollow body. In this case, the substrate surface forms a three-dimensional area. The radiation-emitting layer sequence is then therefore applied to the inner area of the hollow body at least in places. Preferably, the radiation-emitting layer sequence in this case forms a closed, circumferential and curved layer. At all events, the radiation-emitting layer sequence describes a three-dimensional area which extends in all spatial directions.

In accordance with at least one embodiment, the substrate body is embodied as a hollow body and has at least one tapered section. Points lying opposite one another on the inner area of the hollow body approach one another in the region of the tapered section. In this case, the points can approach one another in such a way until they touch in a bead. That is to say that the hollow body can be closed toward the outside in the region of the tapered section by means of its inner areas being brought together. A hermetic sealing of the component can then be arranged in the region of the tapered section. For this purpose, either additional sealing material can be introduced into the hollow body in the region of the tapered section, or the inner areas of the hollow body are brought together in such a way that they form a bead that hermetically tightly seals the hollow body toward the outside.

Furthermore, it is possible for connecting lines for making electrical contact with the radiation-emitting layer sequence to be arranged in the region of the tapered section, said connecting lines leading into the substrate body from outside the substrate body. By way of example, said connecting lines are metal wires.

By way of example, it is possible for the substrate body to be embodied as a hollow body and to consist of glass. In this case, in one simple embodiment, the substrate body can be embodied as a hollow cylinder. In the region of the tapered section, the diameter of the cylinder decreases to form a bead in which points lying opposite one another on the inner area of the hollow body can touch. That is to say that the glass cylinder is fused to form a bead in the region of the tapered section. In this case, the cylinder can have such a tapered section at both end faces, wherein, through one or both of the tapered sections, in each case at least one electrical connecting line can be led, via which electrical contact can be made with the radiation-emitting layer sequence hermetically sealed in the hollow body.

Overall, the substrate body, which is embodied as a hollow body in accordance with at least one embodiment, forms at least one portion of a hermetic encapsulation in accordance with at least one embodiment of the component described here. That is to say that the substrate body has a double function: firstly, it provides the substrate surface for the application of the radiation-emitting layer sequence. Secondly, it hermetically encapsulates said layer sequence against external influences such as moisture and atmospheric gasses.

That is to say that, in accordance with at least one embodiment of a component described here, the radiation-emitting layer sequence is deposited onto the inner side of a hollow body, for example of a glass tube. After the deposition process, the hollow body is covered at its inner areas on all sides with the radiation-emitting layer sequence. Afterward, at its ends, the hollow body can be fused or sealed with hermetically tight cups. In this way, it is possible to dispense with an additional encapsulation layer. Furthermore, it is not necessary to introduce drying agent into the hollow body. The component can therefore be free of drying agent or getter material.

With regard to protection against moisture and atmospheric gasses, a component having, in principle, unrestricted durability is obtained in this way.

What can be considered to be a further advantage is that an inexpensive glass tube such as is already produced for traditional fluorescent lamps, for example, can be used as the substrate body. Furthermore, there is the possibility of using standardized mounts and electrical connections such as are already used for fluorescent tubes or are customary for energy-saving lamps. In this case, it proves to be advantageous that a hollow body can be coated with virtually one hundred-percent material efficiency at its inner side since hardly any material not used for coating can escape. Besides glass tubes, differently shaped bodies such as, for example, spheres, general cylinders or spirals are also conceivable for forming the substrate body.

In accordance with at least one embodiment of the organic, optoelectronic component described here, the substrate surface is formed by at least one portion of the outer area of the substrate body. That is to say that, in this embodiment, the material of the radiation-emitting layer sequence is not applied to the inner area of a hollow body, but rather to the outer area of the three-dimensional substrate body. In this embodiment, too, the radiation-emitting layer sequence extends in all spatial directions and preferably forms a closed area extending around the substrate body. The radiation-emitting layer sequence forms a three-dimensional curved area. In other words, the radiation-emitting layer sequence in this embodiment can be applied to the outer area of, for example, a spiral or rod-shaped three-dimensional body. This embodiment also affords the advantage that the radiation-emitting layer sequence—on account of its three-dimensional extent—can emit electromagnetic radiation in a large spatial region.

In accordance with at least one embodiment of the component described here, the component comprises an encapsulation body alongside the substrate body. The encapsulation body is a three-dimensional body embodied as a hollow body. In this case, the hollow body is dimensioned in such a way that it is suitable for accommodating the substrate body. The substrate body is then arranged within the encapsulation body at least with those regions of the substrate body to which the radiation-emitting layer sequence is applied.

In one simple embodiment, the substrate body is formed by a cylindrical rod coated circumferentially with the radiation-emitting layer sequence. The encapsulation body is then formed by a hollow cylinder, into which the substrate body is pushed. That is to say that, in this embodiment, the radiation-emitting layer sequence is not situated at the inner area of a hollow body, but rather at the outer area of a three-dimensional substrate body, downstream of which on all sides an encapsulation body can be disposed in the emission direction.

A hermetic sealing of the substrate body in the encapsulation body can then be effected in the same way as has already been described for a substrate body embodied as a hollow body. That is to say that, in accordance with at least one embodiment, the encapsulation body embodied as a hollow body can have a tapered section, wherein a hermetic sealing of the component is arranged in the region of the tapered section. By way of example, the encapsulation body can be fused at its end faces in each case to form a bead. In this case, it is once again possible for connecting lines to extend into the encapsulation body from outside the encapsulation body. Via the connecting lines, electrical contact can be made with the radiation-emitting layers arranged on the substrate body.

In accordance with at least one embodiment, the substrate body is embodied in electrically conductive fashion and the radiation-emitting layer sequence is electrically conductively connected to the substrate body. Preferably, precisely one electrode to which the radiation-emitting layer sequence is electrically connected then adjoins the electrically conductive substrate body or the substrate body itself forms the electrode to which the radiation-emitting layer sequence is directly applied. Such an embodiment is advantageous in particular for a component described here if the radiation-emitting layer sequence is applied to the outer area of the three-dimensional substrate body. In this case, the substrate body can have a base body, which is coated with an electrically conductive material such as a metal or consists of an electrically conductive material such as a metal, for example. It is thus possible, in particular, for the substrate body in this case to be formed by a cylindrical or spiral metal rod.

In accordance with at least one embodiment of the component described here, the substrate body and/or the encapsulation body are/is formed with a glass. That is to say that these bodies can consist of a glass or contain a glass. A glass proves to be particularly advantageous in particular for the sealing of a hollow body since the hollow body can be fused for example at its open ends in a simple manner in a bead, which then forms a hermetic sealing. Furthermore, glass-containing bodies can be hermetically sealed particularly well by means of a glass solder material or a glass frit material.

In accordance with at least one embodiment of the component described here, the substrate body and/or the encapsulation body are embodied at least in places in the manner of one of the following geometrical bodies: sphere, general cylinder, spiral. In this case, the bodies do not have to follow the exact geometrical form of one of said bodies; in the region of the sealing, in particular, these bodies can deviate from the basic geometrical forms described. However, a substrate body and/or an encapsulation body can also be embodied as mixed forms of the bodies described, for example in a pear-shaped fashion like a conventional incandescent bulb. If the substrate body and/or the encapsulation body, in terms of its basic form, is embodied like a sphere, it can, for example, have the form of a Christmas tree ball and have a cylindrical projection in the region of its sealing.

In accordance with at least one embodiment of the component described here, the substrate surface is free of edges. What is common to the basic geometrical forms described above is that the substrate surface can be formed on them in a manner free of edges. That is to say that the substrate surface has no edges which run at an acute angle. In particular, in this embodiment, the substrate body is not formed by a parallel-epipedal body. This is because it has been found that, at the edges of such bodies, faults can occur in the radiation-emitting layer sequence or the electrodes of the component and uniform luminous emission of the entire radiation-emitting layer sequence is thus made more difficult.

In accordance with at least one embodiment of the component described here, the component comprises two substrate bodies. In this case, the component has a first substrate body, which is embodied as a hollow body, wherein the substrate surface of the first substrate body is formed by at least one portion of the inner area of the hollow body. Said substrate surface is provided with a first radiation-emitting layer sequence.

The second substrate body has a substrate surface formed by at least one portion of the outer area of the second substrate body. A second radiation-emitting layer sequence is applied to said substrate surface.

The first substrate body, which is embodied as a hollow body, then forms the encapsulation body for the second substrate body, wherein at least those regions of the second substrate body to which the radiation-emitting layer sequence is applied are arranged within the first substrate body. In this way, it is possible, for example, to specify a component which has at least two radiation-emitting layer sequences.

In this case, the first radiation-emitting layer sequence, on the first substrate body is preferably transparent to the electromagnetic radiation generated by the second radiation-emitting layer sequence.

Radiation of the electromagnetic radiation emitted by the two radiation-emitting layer sequences escapes from the component.

A component of this type is distinguished not only by its simple producibility but also by its particularly good hermetic encapsulation. By means of the combination of different substrate bodies, an extensive range of different components can be produced in production; by way of example, in this way the production of cold-white and warm-white light sources is possible in a particularly simple manner.

In accordance with at least one embodiment, the substrate body and/or encapsulation body are/is in each case embodied in an integral fashion. That is to say that these bodies are not composed of a plurality of partial bodies, but rather are embodied, for example, as an integral tube or integral rod.

BRIEF DESCRIPTION OF THE DRAWINGS

The component described here is explained in greater detail below on the basis of exemplary embodiments and the associated figures.

FIGS. 1 to 7 in this case show schematic illustrations of components described here and also basic schematic diagrams for methods for producing components described here.

DETAILED DESCRIPTION OF THE DRAWINGS

Elements which are identical, of identical type or act identically are provided with the same reference symbols in the figures. The figures and the size relationships of the elements illustrated in the figures among one another should not be regarded as to scale. Rather, individual elements may be illustrated with an exaggerated size in order to enable better illustration and/or in order to afford a better understanding.

Figure 1A:
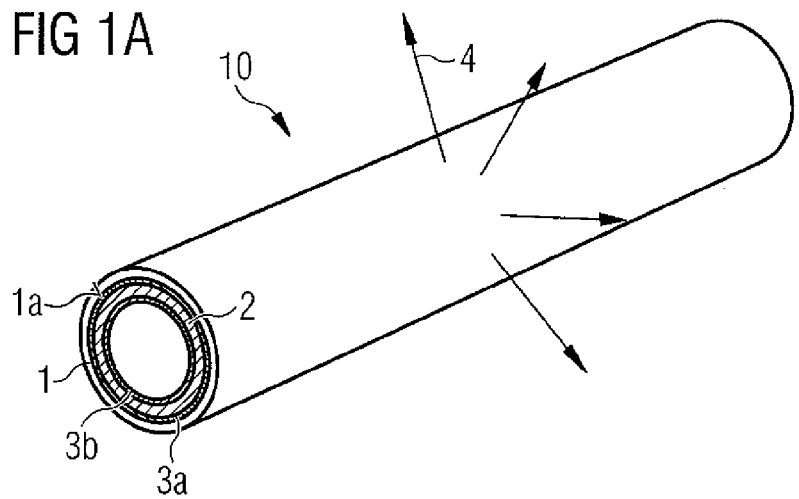

FIG. 1A shows a component 10 described here on the basis of a schematic perspective illustration. The component 10 has a substrate body 1, which consists of a glass. The substrate body 1 is shaped in the manner of a cylindrical rod in the present case. The substrate body 1 forms a hollow body, at the inner area of which the substrate surface 1a is formed.

The first electrode 3a of the component is applied on the substrate surface 1a. In this case, the first electrode 3a circumferentially coats the inner area of the substrate body 1.

The radiation-emitting layer sequence 2, which comprises at least one organic emitter material, is applied to the first electrode 3a.

The second electrode 3b is arranged at the outer area of the radiation-emitting layer sequence 2 which is remote from the first electrode 3a. The outer area of the layer sequence 2 that faces the second electrode 3b is a three-dimensionally curved area.

During the operation of the component 10, electromagnetic radiation 4 is generated in the radiation-emitting layer sequence 2, said electromagnetic radiation leaving the substrate bodies 1 radially. That is to say that the component has a radial emission characteristic.

Figure 1B:
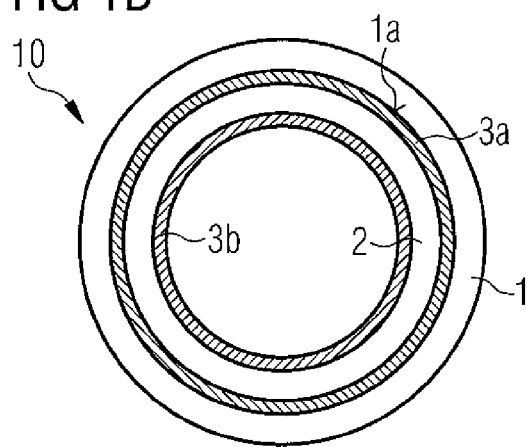

The layer sequence for the component described in conjunction with FIG. 1A is illustrated once again in conjunction with FIG. 1B, on the basis of a schematic sectional illustration.

Figure 1C:
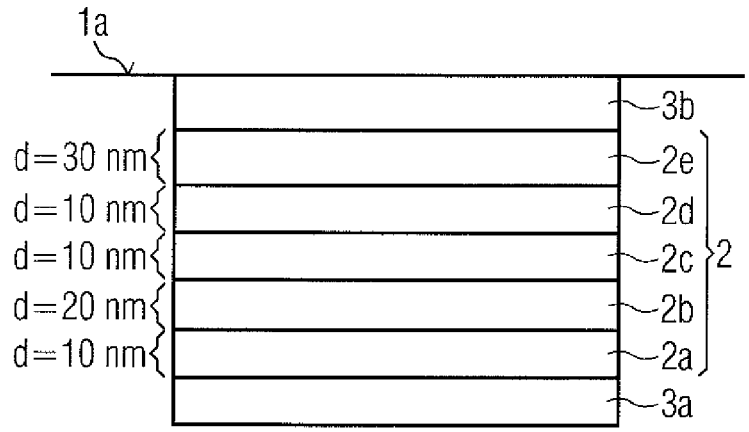

FIG. 1C shows, on the basis of a schematic illustration, a possible layer succession for forming the electrodes 3a, 3b and also the radiation-emitting layer sequence 2. In this case, the first electrode 3a is preferably formed from a radiation-transmissive material such as ITC (indium tin oxide).

The radiation-emitting layer sequence 2 comprises, for example, the following layer construction suitable for generating white light:
- a layer 2a directly succeeding the first electrode 3a and comprising 1-TNATA,
- a layer 2b directly succeeding the layer 2a and comprising s-TAD,
- a layer 2c directly succeeding the layer 2b and comprising SEB-010:SEB020,
- a layer 2d directly succeeding the layer 2c and comprising TMM-004:Ir(ppy)3 (15%), and
- a layer 2e directly succeeding the layer 2d and comprising TMM-04:TER012.

By way of example, the layers of the radiation-emitting layer sequence 2 have the following thicknesses:
- the layer 2a has a thickness d of approximately 40 nm,
- the layer 2b has a thickness d of approximately 20 nm,
- the layer 2c has a thickness d of approximately 10 nm,
- the layer 2d has a thickness d of approximately 10 nm, and
- the layer 2e has a thickness d of approximately 30 nm.

In this case, the emission of electromagnetic radiation generated in the radiation-emitting layer sequence 2 takes place through the first electrode 3a, which is embodied in radiation-transmissive or transparent fashion.

The second electrode 3b forms a cathode and is formed from a reflective metal such as silver or aluminum, for example. Electromagnetic radiation 4 generated in the radiation-emitting layer sequence 2 is therefore reflected at the second electrode 3b in the direction of the substrate body 1 and can pass through the transmissive first electrode 3a firstly into the substrate body 1 and from there toward the outside.

A transparent layer sequence 2 with transparent electrodes 3a, 3b can also be deposited in and/or on the substrate body 1. Thus, it is possible to use, for example, a transparent tube with a transparent OLED at the inner side. This makes it possible to produce a better color mixture over the viewing angle.

Figure 2A:
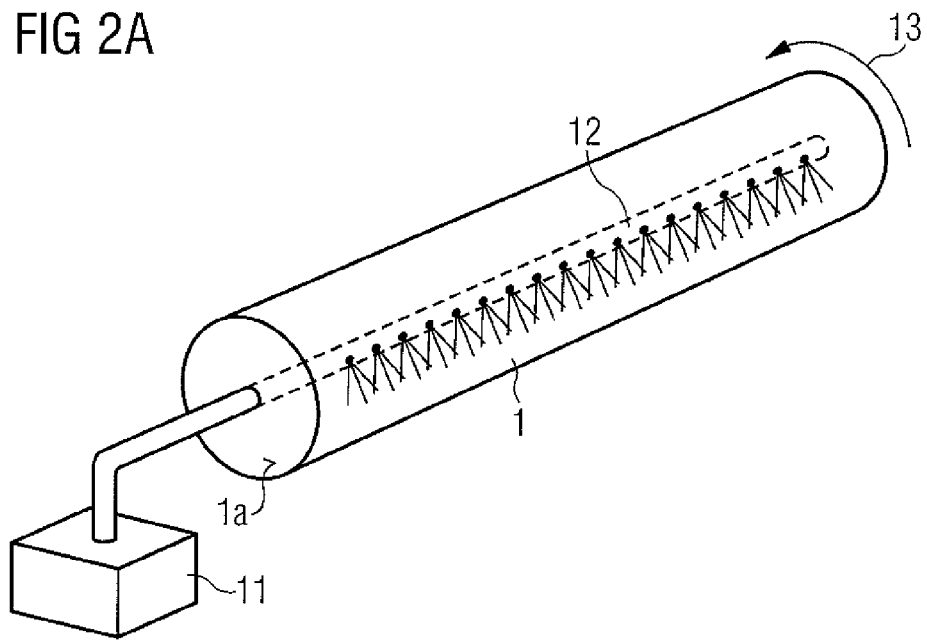
Figure 2B:
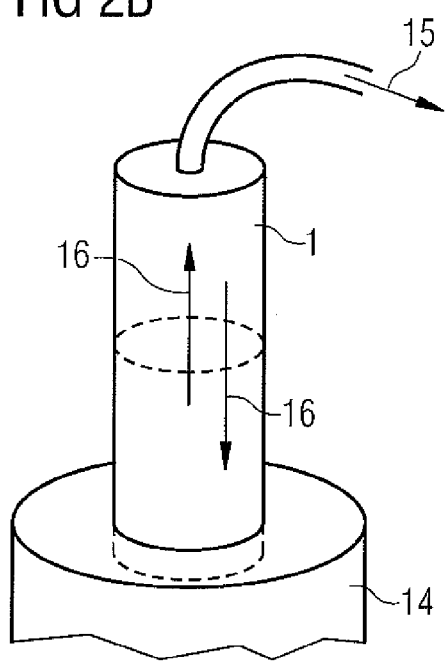

Two different possibilities for producing a component described in conjunction with FIGS. 1A to 1C are explained in greater detail in conjunction with FIGS. 2A and 2B, on the basis of second schematic perspective illustrations.

In conjunction with FIG. 2A, a production method is described wherein, by means of a distributing pipe 12, for example, the material of the electrodes 3a, 3b and the radiation-emitting layer sequence 2 from the evaporator 11 are applied to the inner area of the substrate body 1. The substrate body is rotated in a rotation direction 13 during coating. In this way, the substrate surface 1a of the substrate body 1 is coated uniformly by means of a linear coating apparatus.

Alongside vacuum deposition methods for the radiation-emitting layer sequence 2 and methods for producing the electrodes 3a, 3b such as MBE (molecular beam epitaxy), VTE (vacuum thermal evaporation), sputtering, PECVD (plasma-enhanced chemical vapor deposition), there are also conceivable liquid phase processes such as sol-gel methods, dip-coating, spraying, doctor-blading, wet processing coating or hybrid production methods.

Thus, in the case of the production method described in conjunction with FIG. 23, by means of a pump, for example liquid material for forming the radiation-emitting layer sequence 2 is transported from a reservoir 14 in the direction of a pump direction 15. The material flows in the direction 16 along the substrate surface 1a of the substrate body 1 and coats the substrate body 1 in this way.

Even for curved, for example spiral, glass tubes as substrate bodies 1, the use as compact lamps is appropriate. A spiral vapor deposition source can be introduced even into or onto such spiral substrate bodies 1. These substrate bodies 1 can be melted after coating and be placed into a base with a control device (also see FIG. 6). Therefore, in terms of its outer appearance, the component corresponds to a compact energy-saving lamp that is typical nowadays.

Figure 3A:
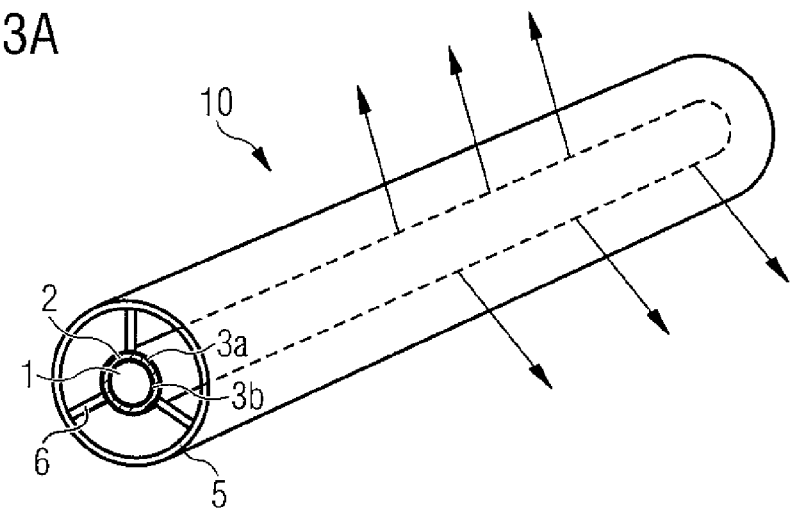

A further exemplary embodiment of a component described here is explained in greater detail in conjunction with FIG. 3A. In this exemplary embodiment, the layers of first and second electrodes 3a, 3b and the radiation-emitting layer sequence 2 are applied to the outer area of the substrate body 1. In this case, the substrate body 1 can consist of glass or be formed from a metal. The substrate body 1 is introduced by means of spacers 6 in the encapsulation body 5, which is embodied as a hollow body. In this case, the layer sequence is as described in conjunction with FIG. 1C.

Figure 3B:
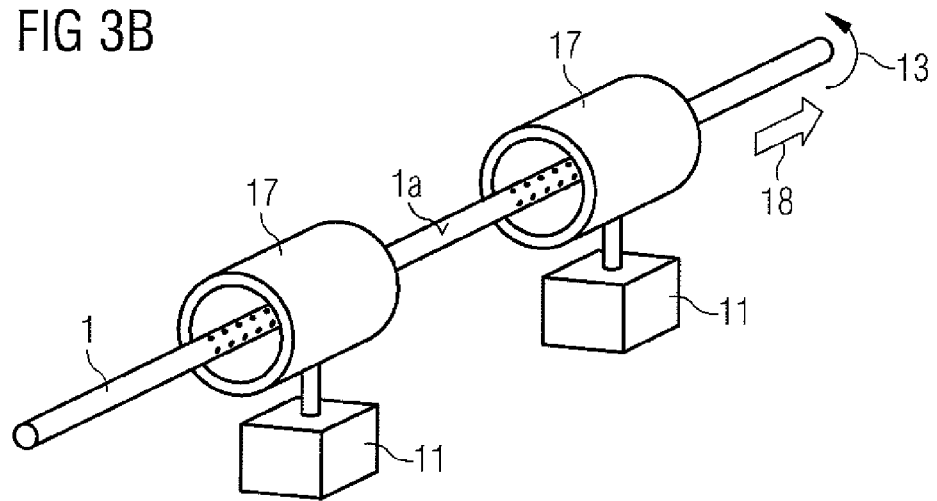

In conjunction with FIG. 3B, a possible method for coating the outer area of the substrate body 1 is shown on the basis of a schematic perspective illustration. In this case, the coating is effected by means of cavity coating apparatuses 17, to which the material to be coated is fed by the evaporators 11. In this case, the substrate body 1 can be displaced in the direction of the translation direction 18, thereby enabling each cavity coating apparatus 17 to apply a different layer of the component to the outer area of the substrate body 1. During coating, moreover, a rotation in a rotation direction 13 of the substrate body 1 can be effected, which additionally leads to a particularly homogeneous coating of the substrate body 1.

Figure 3C:
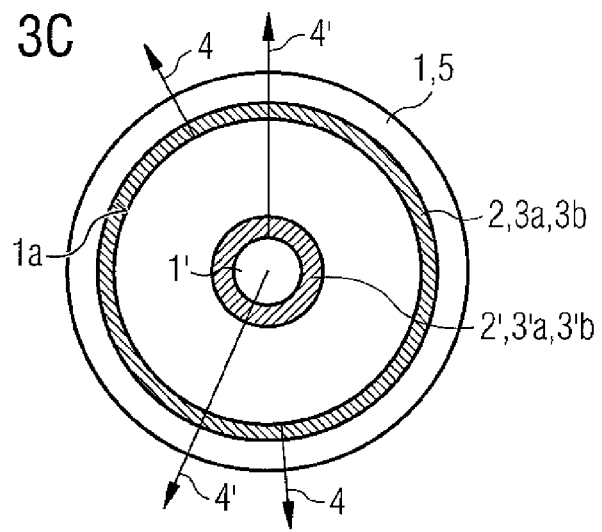

In conjunction with FIG. 3C, a further exemplary embodiment of a component described here is explained in greater detail on the basis of a schematic sectional illustration. In this exemplary embodiment, the component comprises two substrate bodies 1. In this case, the first substrate body 1 is simultaneously an encapsulation body 5 for the second substrate body 1', which can be formed by a rod. In this way, the component comprises two radiation-emitting layer sequences 2, 2', which can comprise different emitter materials and thus emit electromagnetic radiation having different wavelengths. In this way, the component emits mixed radiation 4, 4' from the two radiation-emitting layer sequences. In this case, the second electrode 3b, which is applied to the inner area of the substrate body 1 embodied as a hollow body, is embodied such that it is transparent to the electromagnetic radiation generated in the second radiation-emitting layer sequence 2'.

In conjunction with FIGS. 4A, 4B, 4C and 4D, different possibilities for hermetically sealing components described here are explained on the basis of schematic sectional illustrations.

In the case of the exemplary embodiments in FIGS. 4A and 4B, the sealing is effected by means of a tapered section 7 at the end face of the substrate body 1 and of the encapsulation body 5, respectively. An electrical connecting line 20 is led through the tapered section 7, which connecting line can be used to make contact with the radiation-emitting layer sequence 2. As can be seen from FIGS. 4A and 4B, in this case the same sealing method can be used both for a component in which the substrate body 1 is embodied as a hollow body, and for a component in which the outer area of the substrate body 1 is coated with the radiation-emitting material.

Alternative sealing possibilities are described in conjunction with FIGS. 4C and 4D. In the case of the example described in conjunction with FIG. 4C, a cap 8 composed of glass or ceramic material is hermetically connected to the substrate body 1 and/or the encapsulation body 5 by means of a glass solder or a glass frit. In this case, the melting of the glass solder or of the glass frit material for connecting cap 8 and substrate body 1 and/or encapsulation body 5 can be effected locally by means of a laser beam.

In conjunction with FIG. 4D, an exemplary embodiment is described wherein a ceramic or metal cap is connected to the substrate body 1 and/or the encapsulation body 5 by means of an electrically conductive connecting material 9. A capacitive coupling can then be involved in the case of a ceramic cap 8, and an electrically conductive connection in the case of a metal cap 8. Via the metal cap 8, therefore, the radiation-emitting layer sequence 2 can also be contact-connected via an electrical connection 21.

Figure 5:
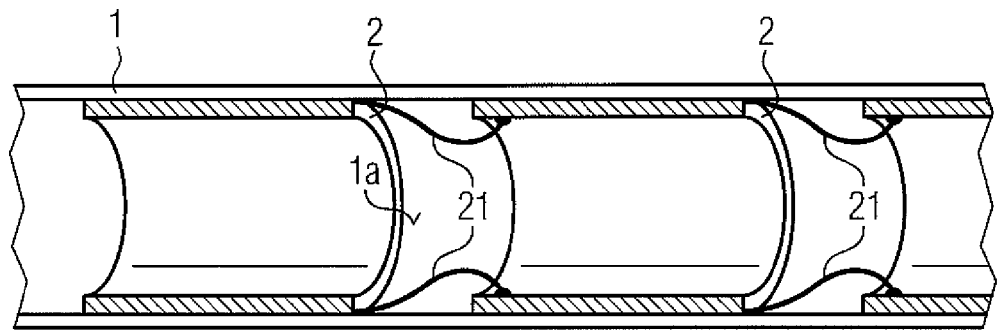

On the basis of the schematic perspective illustration in FIG. 5, an exemplary embodiment of a component described here is explained in greater detail wherein a plurality of radiation-emitting layer sequences 2 are applied separately from one another for example onto the inner area of a substrate body 1 embodied as a hollow body. Said layer sequences are connected in series with one another by means of electrical connections 21. In this case, the radiation-emitting layer sequences 2 applied separately from one another can contain emitter materials that are different from one another, such that they can also be suitable for generating radiation having mutually different wavelengths. That is to say that, in the exemplary embodiment in FIG. 5, the component 10 on the elongate substrate body 1 is segmented into cylindrical disks, for example. In this case, the individual segments are preferably connected in series, as a result of which, although the total voltage increases, the current is reduced. This has advantages with regard to uniformity of current distribution, since the requirements made in respect of the current-carrying capacity are lowered. This is particularly advantageous specifically for transparent electrodes 3a, 3b.

Figure 6:
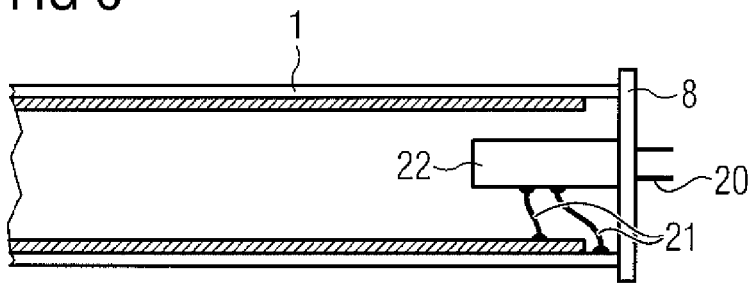

In conjunction with FIG. 6, an exemplary embodiment of a component described here wherein a control device 22 is arranged within a substrate body 1 is explained in greater detail on the basis of a schematic sectional illustration. By way of example, a suitable energization of the radiation-emitting layer sequence 2 with suitable current intensities at suitable voltages can be effected by means of the control device 22. In this case, an exemplary embodiment of this type is also possible for components which comprise an encapsulation body 5.

The driving electronics of the control device 22 can be applied either in the substrate body 1 or in direct extension onto one or both ends of the substrate body 1, such that operation from a voltage source is possible, for example. This has the advantage that different components 10 can be operated from the same supply voltage and provide for themselves the respectively required current by means of the integrated control device 22 itself.

The control device 22 integrated in the component 10 can be configured in such a way that it is possible to directly operate the "OLED fluorescent lamp" with electronic installation used nowadays.

At the end faces of the component 10, measures can be present by means of which energy can be fed to the component 10 even without electrically conductive contact. Said energy can be coupled in inductively or capacitively, for example.

Figure 7A:
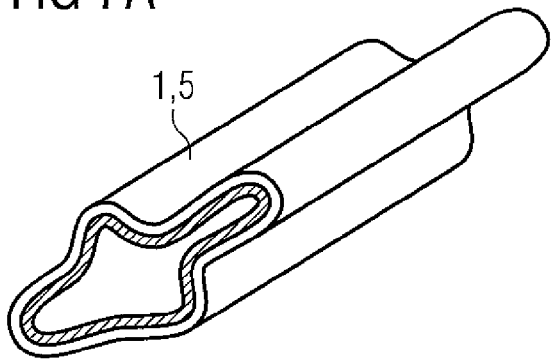
Figure 7B:
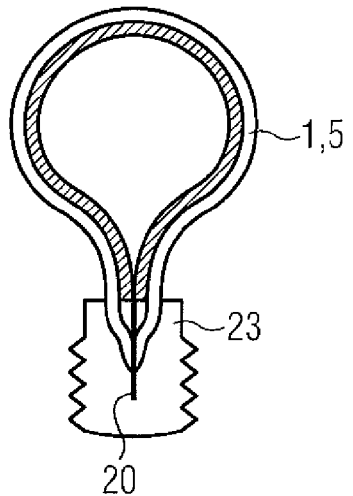

In conjunction with FIGS. 7A and 7B, possible forms for the substrate body 1 and/or encapsulation body 5 of components described here are explained in greater detail on the basis of schematic illustrations. In conjunction with FIG. 7A, a substrate body 1 and/or an encapsulation body 5 is explained in greater detail, which is embodied as a general cylinder. In this case, the form of the body 1, 5 can be adapted to the use requirements and/or design requirements of the component.

In conjunction with FIG. 7B, what is elucidated schematically is that an organic component described here can be embodied in the form of an incandescent bulb which can be electrically contact-connected by means of a base 23, which is embodied as an Edison screw cap for example.

The approach described here is not restricted to components 10 comprising directly emitting layer sequences. Approaches with light conversion by means of a luminescence conversion material are also conceivable, wherein the conversion layer can be situated on or in the substrate body 1, for example. Light scattering in or at the substrate body 1 or the structuring thereof with optical elements such as lenses is also conceivable.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An organic, optoelectronic component comprising:
   a first substrate body forming a hollow body and including a closed first substrate surface formed by at least one portion of an inner area of the hollow body, the closed first substrate surface being exclusively closed via the first substrate body;
   a second substrate body including a closed second substrate surface formed by at least one portion of an outer area of the second substrate body, the closed second substrate surface being exclusively closed via the second substrate body;
   a first radiation-emitting layer sequence including at least one layer containing an organic material; and
   a second radiation-emitting layer sequence including at least one layer containing an organic material;
   wherein the first radiation-emitting layer sequence is applied to the closed first substrate surface and forms a curved area;
   wherein the second radiation-emitting layer sequence is applied to the closed second substrate surface and forms a curved area;
   wherein first substrate body forms an encapsulation body for the second substrate body;
   wherein at least those regions of the second substrate body to which the second radiation-emitting layer sequence is applied are arranged within the first substrate body;
   wherein the closed first substrate surface faces the closed second substrate surface; and
   wherein the first radiation-emitting layer sequence is separated from the second radiation-emitting layer sequence by a cavity.

2. The organic, optoelectronic component according to claim 1, wherein the hollow body includes at least one tapered section.

3. The organic, optoelectronic component according to claim 2, wherein connecting lines for making electrical contact with the first radiation-emitting layer sequence are arranged in a region of the at least one tapered section, said connecting lines leading into the first substrate body from outside the first substrate body.

4. The organic, optoelectronic component according to claim 2, wherein a hermetic sealing of the organic, optoelectronic component is arranged in a region of the at least one tapered section.

5. The organic, optoelectronic component according to claim 1, wherein the hollow body forms at least one portion of a hermetic encapsulation for the second radiation-emitting layer sequence.

6. The organic, optoelectronic component according to claim 1, wherein the second substrate body is electrically conductive and the second radiation-emitting layer sequence is electrically conductively connected to the second substrate body.

7. The organic, optoelectronic component according to claim 1, wherein the first substrate body contains glass or consists of glass.

8. The organic, optoelectronic component according to claim 1, wherein the first substrate body is formed at least in places as one of the following geometrical bodies: a sphere, a general cylinder and a spiral.

9. The organic, optoelectronic component according to claim 1, wherein the closed first substrate surface is free of edges.

10. The organic, optoelectronic component according to claim 1, wherein the second substrate body contains glass or consists of glass.

11. The organic, optoelectronic component according to claim 1, wherein the second substrate body is formed at least in places as one of the following geometrical bodies: a sphere, a general cylinder and a spiral.

12. The organic, optoelectronic component according to claim 1, wherein the closed second substrate surface is free of edges.

13. The organic, optoelectronic component according to claim 1, wherein the first radiation-emitting layer sequence is transparent for the second radiation-emitting layer sequence.

14. The organic, optoelectronic component according to claim 1, wherein the first radiation-emitting layer sequence and the second radiation-emitting layer sequence are hermetically encapsulated exclusively by the first substrate body.

* * * * *

UNITED STATES PATENT AND TRADEMARK OFFICE
CERTIFICATE OF CORRECTION

| | | |
|---|---|---|
| PATENT NO. | : 8,492,973 B2 | Page 1 of 1 |
| APPLICATION NO. | : 13/121060 | |
| DATED | : July 23, 2013 | |
| INVENTOR(S) | : Tilman Schlenker et al. | |

It is certified that error appears in the above-identified patent and that said Letters Patent is hereby corrected as shown below:

In the Claims:

In claim 1, column 10, line 22, after "wherein" (first word) and before "first substrate", insert --the--.

Signed and Sealed this
Twenty-fifth Day of February, 2014

Michelle K. Lee
*Deputy Director of the United States Patent and Trademark Office*